(12) United States Patent
Bruno (10) Patent No.: US 7,991,028 B1
(45) Date of Patent: Aug. 2, 2011

(54) TUNABLE SOLID STATE LASER SYSTEM (76) Inventor: Thomas Bruno, River Ridge, LA (US)

( * ) Notice: Subject to any disclaimer, the term of this patent is extended or adjusted under 35 U.S.C. 154(b) by 0 days.

(21) Appl. No.: 12/661,424

(22) Filed: Mar. 17, 2010

(51) Int. Cl.
H01S 3/04 (2006.01)
(52) U.S. Cl. ............................................ 372/34; 372/36
(58) Field of Classification Search .................... 372/35, 372/46.01, 36, 21, 38.01
See application file for complete search history.

(56) References Cited

U.S. PATENT DOCUMENTS

| 4,933,947 | A | * | 6/1990 | Anthon et al. | 372/34 |
|---|---|---|---|---|---|
| 5,121,398 | A | * | 6/1992 | Rao | 372/20 |
| 5,190,019 | A | | 3/1993 | Harvey | |
| 5,317,447 | A | | 5/1994 | Baird et al. | |
| 5,541,946 | A | | 7/1996 | Scheps et al. | |
| 5,592,503 | A | | 1/1997 | Welch et al. | |
| 5,642,193 | A | * | 6/1997 | Girvin et al. | 356/339 |
| 5,841,570 | A | | 11/1998 | Velsko | |
| 7,016,389 | B2 | | 3/2006 | Dudley et al. | |
| 7,535,936 | B2 | | 5/2009 | Day et al. | |
| 2002/0009111 | A1 | | 1/2002 | Nighan, Jr. et al. | |
| 2002/0126345 | A1 | * | 9/2002 | Green et al. | 359/122 |
| 2009/0232168 | A1 | | 9/2009 | Zhou | |
| 2009/0296755 | A1 | | 12/2009 | Brown et al. | |

* cited by examiner

Primary Examiner — Minsun Harvey
Assistant Examiner — Tuan N. Nguyen
(74) Attorney, Agent, or Firm — Keaty Law Firm LLC (57) ABSTRACT A high-powered diffraction limited diode pumped solid-state source optically end pumps a compact, widely tunable solid state material. Imaging of the collimated pump beam into the tunable medium produces ideal volumetric overlap producing high conversion efficiencies. Fully integrated pump source provides pump energy at or near the peak absorption wavelength. Birefringent elements placed intracavity are used for linewidth narrowing and tuning of the laser wavelength. Tunable active medium is placed in linear cavity arrangement utilizing a confocal or hemispherical arrangement. Mode waist is minimized in crystal such that there is optimal overlap with pump source while simultaneously maximizing extraction efficiency.

37 Claims, 4 Drawing Sheets

TUNABLE SOLID STATE LASER SYSTEM

BACKGROUND OF THE INVENTION

The present invention relates to tunable solid state laser systems, and more particularly to widely tunable systems employing a stable resonator.

Broadly tunable continuous solid-state lasers are attractive sources in medicine, atomic physics, spectroscopy and LIDAR. Popular materials for tunable sources included fluorides and chrysoberyl doped with chromium. The most widely tunable material known to date is titanium doped sapphire. Owing to very broad emission spectrum and excellent material properties, ti:sapphire is the most desirable material as a tunable source. Laser properties are less ideal because of a short 3.2 micro-second fluorescence lifetime but ti:sapphire alleviate this less desirable characteristic with a high emission cross section, excellent thermal conductivity and high melting point. First demonstration of titanium sapphire laser operation was by Peter Moulton in 1982. (P. F. Moulton, "Spectroscopic and laser characteristics of Ti:Al2O3," J. Opt. Soc. Am. B3,133 (1986))

Since first operation, significant improvements in the growth process have substantially diminished reabsorption of the lasing mode. (Iain McKinnie, AnnMarie Oien, Don Warrington, Paul Tonga, Lawrence Gloster, and Terence King "Ti3+ Ion Concentration and Ti:Sapphire Laser Performance", IEEE Journal of Quantum Electronics, Vol. 33, No. 7, July 1997) Improved figure of merit crystals resulted in lower thresholds and higher slope efficiencies by removing a parasitic Ti4+ ion from the sapphire crystalline host. (J Pinto, Leon Esterowitz, Gregg H. Rosenblatt, Milan Kokta, and Dennis Peressini "Improved Ti:Sapphire Laser Performance with New High Figure of Merit Crystals," IEEE Journal of Quantum Electronics, Vol. 30 Nov. 1994 pg. 2612-2616)

A variety of methods have been employed for the production of a compact widely tunable source. In an arrangement by Hansch a z-folded cavity was end pumped using all lines of an argon ion source. A flat end mirror was mounted on a piezotranslator for rapid fine-tuning. For broad tuning a pair of microscope slides were mounted on a tiltable stage. Action of changing the relative spacing between the slides through an angular adjustment allowed tuning from 760-820 nm and 956-1010 nm with differing sets of mirrors. (C. Zimmermann, V. Vuletic, A. Hemmerich, L. Ricci, and T. W. Hansch "Design for a Compact tunable Ti:Sapphire Laser" Feb. 1, 1995/Vol. 20, No. 3/Optics Letters)

A low threshold CW ti:sapphire laser system was demonstrated by Moulton in an x-folded ring configuration using a frequency doubled Nd:YAG system. Low threshold values of 118 and 90 mW occurred with a beam waist of 25 and 16 microns respectively. In the respective publication threshold formalism was adapted and introduced for a four level system during continuous lasing. (James Harrison, Andrew Finch, David Rines, Glen Rines, and Peter Moulton "Low-Threshold, cw, all-solid-state Ti:Al2O3 laser" Apr. 15, 1991/Vol. 16, No. 8 Optics Letters)

$$P_{TH} = \eta_c \frac{\pi h v}{4\tau\sigma}(T + L_{CAV} + L_{XTL})(\omega_o^2 + \omega_p^2)\frac{1}{(1 - e^{-(\alpha l)})}$$

Similar low threshold systems were built for the production of mode-locked pulses using a z-folded cavity without need of a separated mode-locking element. Stable mode locking induced by the nonlinearity of the active medium was termed Kerr Lens-mode locking. A stable Kerr lens-mode-locked ti:sapphire system was demonstrated by Fujimoto using a 8-micron mode waist to produce CW operation threshold with 120 mW and KLM mode-locking with 156 mW of incident pump. (A. M. Kowalevicz, Jr., T. R. Schibli, F. X. Kartner, and J. G. Fujimoto "Ultralow-threshold Kerr-lens mode-locked Ti:Al$_2$O$_3$ Laser" Nov. 15, 2002/Vol. 27, No. 22/Optics Letters)

Multiple strategies have been employed for the process of pumping tunable solid-state media. A common method is to use an arc lamp or comparable light source to excite a laser rod. The laser rod and flash-lamp pump source are placed at the foci of an elliptically shaped reflector. Drawbacks of this method included poor spectral overlap between the absorption of the laser material and the emission of the laser rod as well as poor volumetric overlap and coupling loses at the surface of the rod and sides of the cavity.

Flash-lamp pumping techniques have been applied to Ti:Sapphire materials for the production of high-energy pulses. To overcome the lack of absorption efficiency the flash-lamp emission is converted via fluorescence conversion process into the blue-green emission region. (L. Esterwitz, R. Allen, and C. P. Khattak, in Tunable Solid State Lasers, Vol. 47 of Springer Series on Optical Sciences P. Hammerling, A. Budgor, and A. Pinto, eds. (Spinger-Verlag, Berlin, 1985), pp. 73-75.5) Further improvements were made on the flash-lamp configuration by switching from a coaxial to a linear flash-lamp. Attempts were made to improve the conversion efficiency by altering the content of the liquid dye surrounding the lasant material. (Philip Lacovaora, Leon Esterowitz, and Rodger Allen, Optics Letters, Vol. 10, No. 6 p. 273-275) Despite multiple attempts with Coumarin 504 and LD490 the most efficient solution remained Coumarin 480. Despite higher efficiencies than utilizing non-fluorescent cooling media, coumarin dye lacked stability. Decreases of 20% or more were reported after only a few hundred shots at 35 J.

Shortly after the introduction of highly efficient room temperature operated single emitters, diodes were implemented in end pumped solid-state laser configurations. In U.S. Pat. No. 3,982,201, Rosenkrantz et al. introduce a solid-state laser that is pumped by single diode lasers or arrays of diode lasers to which the solid-state laser rod is 'butt coupled' or end pumped. Early generations of diode arrays utilized low duty cycle operation to reduce thermal fluctuations allowing the diode to maintain spectral stability.

Increasing potential output power implementing single emitter and diode arrays lead to further developments in pump configurations. In U.S. Pat. No. 4,710,940, Sipes, Jr. introduces a Nd:YAG solid-state laser that is end-pumped by a diode laser array or by two diode laser arrays by combining the respective outputs through the usage of polarizing beam-splitting cubes. To account for ideal overlap behavior in such arrangements, Sipes, Jr., references the observation of D. G. Hall in "Optimum mode Size Criteria for Low Gain Laser," Applied Optics, 579-583, vol. 20, (May 1, 1981), and reiterates the presumption "pump profile shape does not matter much as long as all the pump light falls within the resonator mode." Sipes, Jr., states that to maintain ideal overlap and overcome the divergence problem one could implement cylindrical lenses mounted in the sagittal and tangential plains. Baer presents in U.S. Pat. No. 4,761,786, described a Q-switched, solid-state laser that is end-pumped by a single emitter diode laser or diode laser array. The invention is shown to collect the emitted light using collimating lens and focus the collimated beam directly into the end face of the rod. Baer discusses the possibility of correcting for astigmatism prior to the collimating and pump optics.

The aforementioned strategies are well known for coupling the output of high-power diode laser into solid-state materials. Differing divergences and beam quality in the sagittal and tangential plane are due to the asymmetry in spatial distribution of the diode emission area. Beam quality of a stable emitter is often correlated to the emitter width. The ideal beam presumed to have an emitter width comparable to the height. However, catastrophic optical damage leads to limitations in the width of the diode stripe. Typical values are 15-30 mW per micron width while heights are on the order of one micron. A commonly used combination of vertically layered materials used for the production of such devices is aluminum gallium arsenide (AlGaAs).

These so called broad-area lasers, with emitter widths greater than 5-10 microns often show a filamentary formation arising from nonlinear interactions between the laser field and the carrier signal within the active stripe. Upon reaching a population inversion, rapid increase in intra-cavity flux narrows the gain region by inducing in the central region of the stripe a higher refractive index. Contribution of the lower index modes decreases in response to the lateral variation of index. The lateral deviation in index across the profile of the stripe induces a guided effect in the diode stripe leading what is referred to as gain guiding. In a broad area single emitter diode the stripe will typically have an emission width greater than 10-15 microns in higher power emitters up to 400 microns. Within the lateral region multiple index-guided structures will form within the active area. Each index-guided region forms a filament, which is not spatially coherent with adjacent filaments. The filaments within the active material are the fundamental causes of spatial incoherence and are what leads to limitations in brightness.

A variety of methods have been described for generating laser output in the 532 nm wavelength range from solid-state lasers and diode lasers by utilizing the nonlinear process of second-harmonic generation (SHG). For example, several methods have been described for producing SHG laser output in the 520-540 nm wavelength range from diode-pumped solid-state lasers containing neodymium-doped host materials. Baer, et al. in U.S. Pat. No. 4,653,056 described a method in which an AlGaAs diode laser end-pumps solid-state laser resonator containing a Nd:YAG rod and potassium titanium phosphate (KTP) nonlinear crystal to produce SHG laser output at 532 nm.

Kozolvsky, et al. in their article *"Efficient Second Harmonic Generation of a Diode-Laser-Pumped CW Nd:YAG Laser Using Monolithic MgO:LiNbO₃ External Resonant Cavities,"* (IEEE Journal of Quantum Electronics, vol. 24, No. 6 (June 1988)), describe producing about 30 mW of SHG output at 532 nm by using a diode-pumped Nd:YAG, single mode ring laser operating at 1064 nm to pump an external monolithic cavity of nonlinear magnesium oxide: lithium niobate ($MgO:LiNbO_3$). Since Kozolvsky's publication methods of efficiently converting 1064 nm into 532 nm light via seconds harmonic generation have vastly improved. Brown et al. states that "efficiency from the 808 nm pump diode output to green output in the range of 10-30% for Nd:YVO$_4$" in Brown et al. U.S. Pub. No.: US 2006/0098696.

Another example of a diode-pumped tunable laser is disclosed in U.S. Pat. No. 5,317,447 issued to Baird et al. The '447 patent teaches a high-power semiconductor diode laser or array of semiconductor diode lasers that optically end-pumps a compact, tunable laser with a pumping beam well-matched to the absorption bandwidth and mode volume of the solid-state laser. Tilted birefringent plates mounted in the solid-state resonator cavity control the spectral bandwidth and wavelength output of the wave-guide pumping beam. The diode pump laser of the '447 patent is said to produce an almost round beam with 610-690 nm wavelength range (well matched to the absorption of the tunable material).

Researchers are in need of a small footprint, low cost, broadly tunable laser source providing high brightness, intensity and excellent beam quality over wide range of wavelengths. Light sources such as these serve as a research tool in a variety of applications, for instance for the investigation of absorption and transmission of optical materials, biological samples and general chemical analysis, and others.

The present invention contemplates elimination of drawbacks associated with the known laser systems and provision of a tunable solid-state laser system capable of producing a TEM 00 diffraction limited tunable output using a high quality diffraction limited solid state pump source for end pumping.

SUMMARY OF THE INVENTION

It is, therefore an object of this invention to provide a tunable solid-state laser system configured to produce a round output.

Another object of the invention is to provide a method for producing a wide tunable output using a compact linear cavity configuration.

A further object of the invention is to produce a compact efficient widely tunable laser system capable of producing high extraction efficiency and output stability.

Still another object of the invention is to produce a laser system configured to generate tunable light in the 660-1170 nm range.

These and other objects of the invention are achieved through a provision of a widely tunable coherent source of radiation, which is optically end-pumped by a diode pumped solid-state arrangement. The device uses a stable plano-plano semiconductor diode for pumping, while removing the beam shaping optics common in known lasers, such as for instance the Baird laser. The pump laser medium used in the instant device can be pumped near field in a process known as direct pumping or close-coupled pumping. This process is facilitated by providing a neodymium-doped crystal and coating both faces of the Nd:-doped crystal. The entry face toward the pump is a high reflector (HR), and the exit face oriented toward the frequency doubling crystal (KTP) is AR coated while opposite face of the KTP is HR coated at the lasing wavelength. The device is configured to generate tunable light source in the 660-1170 nm range. Device configuration designed to enable ideal extraction efficiency and output scalability.

In one aspect, the output from a broad area single emitter module is used to direct pump a bulk crystal in a monolithic resonator configuration. The pump diode facet is placed on the order of a few microns from the anti-reflection coated bulk crystal, such as a neodymium-doped crystal.

Furthermore, the laser system of this invention provides for a BASE module pumped solid-state laser which end pumps the tunable laser medium. Ti:sapphire material is arranged in a linear cavity configuration in which the solid-state laser reaches threshold operation at low pumping power. The output of the Nd:-doped crystal is a high quality TEM 00 beam, which is converted intracavity into 532 nm green light. The 532 nm beam is near the absorption peak of 495 nm of the Ti:Sapphire material. The Nd:-doped/KTP combination allows for the production of high quality green light in compact configuration without the use of beam-shaping optics. The Ti:Sapphire crystal has entry and exit surfaces cut at Brewster's angle, which allows for very low intra-cavity laser losses as well as low pump coupling losses.

In still another aspect, a Q-switch is inserted into the solid-state laser resonator cavity to produce a laser output (<150 ns), Q-switched pulses. In a further aspect, the continuous wave (CW) laser output power can be tuned over a wide range utilizing the broad emission spectrum for the titanium sapphire lasing medium.

Method of utilizing the diffraction limited pump source in a highly efficient configuration allows for the production of a compact system. Ideal laser behavior is generated by optimizing the volumetric overlap and minimizing the mode waist in the crystal thereby increasing the laser saturation intensity. The value laser saturation intensity in turn maximizes the Ti:Sapphire extraction efficiency.

BRIEF DESCRIPTION OF THE DRAWINGS

Reference will now be made to the drawings, wherein like parts are designated by like numerals, and wherein.

DETAIL DESCRIPTION OF THE INVENTION

Figure 1:
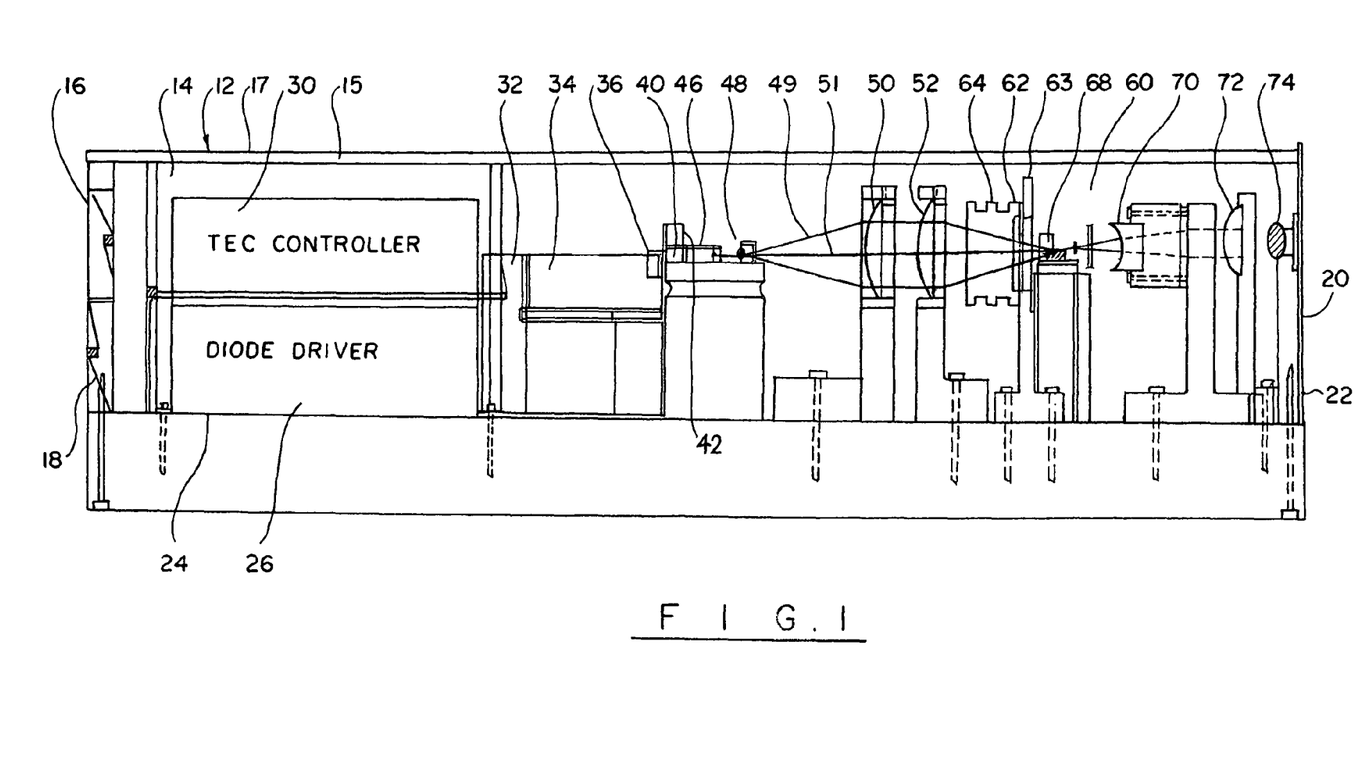
FIG. 1 is schematic view of the laser system of the present invention.

Turning now to the drawings in more detail, numeral 10 designates the laser device of the present invention. The device 10 comprises a compact housing 12 defining a closed chamber 14 for housing the electrical and optical components of the system. The housing 12 has an open portion 15 formed in a top plate 17. The open area 15 is designed to accommodate an optional control panel, which can be a touch screen with a display in some of the preferred embodiments. One end wall 16 of the housing 12 carries a cooling fan 18, while the opposite end wall 20 is provided with vents 22.

Mounted on a base plate, or bottom wall 24 of the housing 12 is a diode driver 26, which forms a part of a diode laser package in the system of this invention. A power supply 30 is operationally connected to the diode driver 26. The power supply 30 can be operationally connected to a laser diode driver configured to supply electrical current to the high-power, stable resonator BASE module diode driver or emitter 26 that produces an optical output greater than 1 watt of continuous wave power. A power supply heat sink 32 is mounted in operational relationship to the power supply 30, and a laser diode heat sink 34 is coupled to the diode driver 26.

An amplifying pumping element, which can be a laser diode 36 can be mounted directly on a close-coupled solid state lasing element or lasing crystal 40. The pumping element is configured to pump the light beam @ 808 nanometers. Alternatively, the pumped beam may be directed through correction and collimating optics first. The lasing crystal 40 can be a chip of Nd:YVO$_4$ 3-5 mm on a side and 1-3 mm in thickness. The neodymium-doped yttrium vanadate based crystal has a typical laser emission wavelength of about 1064 nm, the same as for Nd:YAG, which can be alternatively used as an amplifying crystal. A Nd:YAG (Neodymium Doped Yttrium Aluminum Garnet) crystal that can be used in the instant system is antireflection (AR) coated at 808 nm face to reduce coupling losses. In one aspect, the lasing crystal 40 has a first, upstream side high reflection (HR) coated at 1064 nm. A second, flat exit face of the Nd:YAG crystal 40 is HR coated 808 nm and AR 1064 nm. The TEC controllers 30 are used to regulate the temperature of the pump diode 36 for general cooling and to temperature tune its wavelength to the optimum for the absorption band of the Neodymium in the lasing crystal (around 808 nm). Other amplifying crystal may be used, as well. A cover 42 protects the lasing crystal 40.

For continuous-wave operation, Nd:YVO$_4$ allows overall similar performance to Nd:YAG in cases with medium or high power. Due to its high emission cross section, Nd:YVO$_4$ may be better than Nd:YAG for lasers with very low threshold pump power.

A light optimizing solid-state optical laser medium, which can be a potassium titanium phosphate (KTP) nonlinear crystal 46 is close-coupled with the lasing crystal 40 and is mounted in a light-receiving relationship downstream of the lasing crystal 40. The distance between the lasing crystal 40 and the KTP crystal 46 is minimal, less than 1 micron. The KTP crystal 46 is configured to further optimize output power in generating of the output green light. In operation, the optimizing KTP crystal is configured to double the frequency of the light wave passing through the laser device. In one aspect, the first upstream side of the KTP crystal 46 is antireflection (AR) coated at 1064 nm, while the exit face is HR coated at 1064 nm. The lasing element 40 and the laser medium 46 are configured to convert frequency of the light wave passing through these solid state optical elements.

A laser beam expander optical element 48 is aligned with the KTP crystal 46 to receive the 532 nm light beam pumped by the diode 36. The laser beam exiting the optimizing crystal 46 is expanded to a suitable diameter using the beam expander 48, which is preferably located in front of the focusing optics to keep the optimal component dimensions small and less expensive. Like telescopes, beam expanders are afocal systems. A conventional beam expander with two optical subsystems, the entrance and exit optics, can be used in the device 10. In the beam expander 48, the beam is focused with a short focal length lens and then the highly divergent beam is collimated with a larger beam waist.

The expanded light beam 49 exiting the beam expander 48 is directed to a collimating lens 50, which is configured to receive output generated by the crystal arrangement and produce a collimated beam. The collimating lens 50 is mounted transversely to an axis of the light beam 49 so as to minimize aberrations within the diffraction limited pump source of the laser diode generated light beam. A focusing lens 52 is mounted on the exit side of the collimating lens 50. The focusing lens 52 is configured to produce the desired beam diameter within a usable working distance. The collimating lens 50 and the focusing lens 52 form beam imaging optics in the device of the present invention.

The device 10 comprises an optical cavity or optical stable resonator 60 with an arrangement of mirrors that forms a standing wave cavity resonator by the provision of pump light directed by focusing lens 52. A flat high reflective mirror element 62 is mounted on a flexure mount 64 and forms one end of the resonator cavity.

A solid-state lasant 68 is mounted in axial alignment with an axis 51 of the light beam passing through the lenses 50, 52 and the mirror 62. In one aspect of the invention, the lasant 68 comprises a titanium doped sapphire crystal Ti:Al$_2$O$_3$. The preferred dopant level for titanium employed in the current invention is between 0.06-0.5 wt %. The length of the tunable solid-state lasant 68 is typically selected such that the mathematical product of the tunable medium length and the absorption coefficient of the lasant at the preselected DPSS wavelength is greater than or equal to one. The pumping beam radius within the active medium is selected to substantially overlap within the resonator cavity mode radius.

The Ti:sapphire material is arranged in a linear cavity configuration in which the solid-state laser reaches threshold operation at low pumping power. The Ti:sapphire laser 68 is pumped with the frequency-doubled Nd:YAG or Nd:YVO laser with a wavelength of 531 to 533 nanometers. The titanium-sapphire lasant is particularly beneficial in this continuous wave laser to generate extremely narrow linewidths tunable over a wide range.

A curved output coupler mirror element 70 is mounted downstream of the laser 68. The concave output coupling mirror 70, partly transmissive at the lasant emission wavelength, forms the opposite end of resonator cavity 60. The output coupling mirror 70 uses a partially reflective coating at the lasing wavelength. The curvature of the inner lens surface of element 72 can be designed to give a collimated laser output. Collimating lens surface generally has an anti-reflection coating applied to maximize the power. The length and dopant level of the crystal 68 are selected concurrently with the pump radius, resonant mode radius, and output coupler transmission to generate advantageous values for production of low threshold high slope efficiency operation of the tunable medium.

A dichroic coating is applied to a preferred curved surface of a rear resonator mirror 63. Dichroic coating is highly transmissive at the preselected DPSS pump wavelength such as 532 nm and highly reflective at a preselected lasant emission range such as 650-1170 nanometers. Lasant entry and exit surfaces may be coated for high transmission at the lasant emission wavelength. The output coupling mirror 70 that is partly transmissive at the lasing emission wavelength has a pre-determined selected radius of curvature. When used as one of the reflective surfaces of resonator cavity 60, the lasant pump surface is fabricated with an appropriate radius of curvature.

A collimating output lens 72 is mounted in the chamber 14 to collimate the laser beam tuned in the resonator cavity 60. A light filter 74 is secured adjacent the second end wall 20 of the housing 12. The residual non-absorbed green wavelength light is filtered out so that only infrared wavelength light exits the housing 10.

Figure 2:
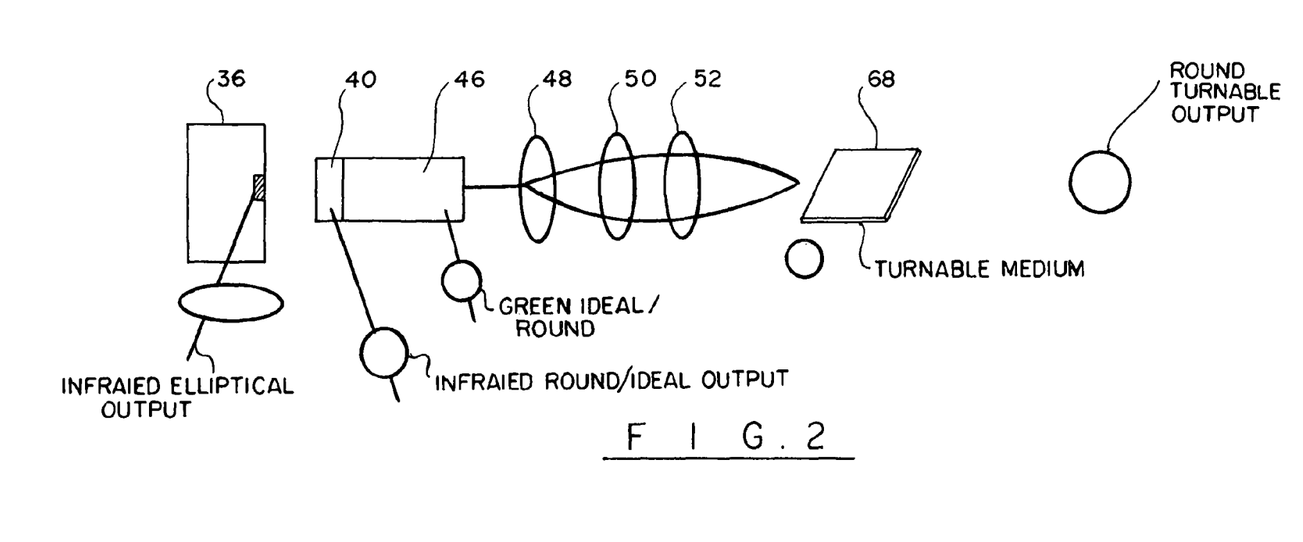
FIG. 2 is a block diagram illustrating production of a round tunable output using the laser system of the present invention.
Figure 3:
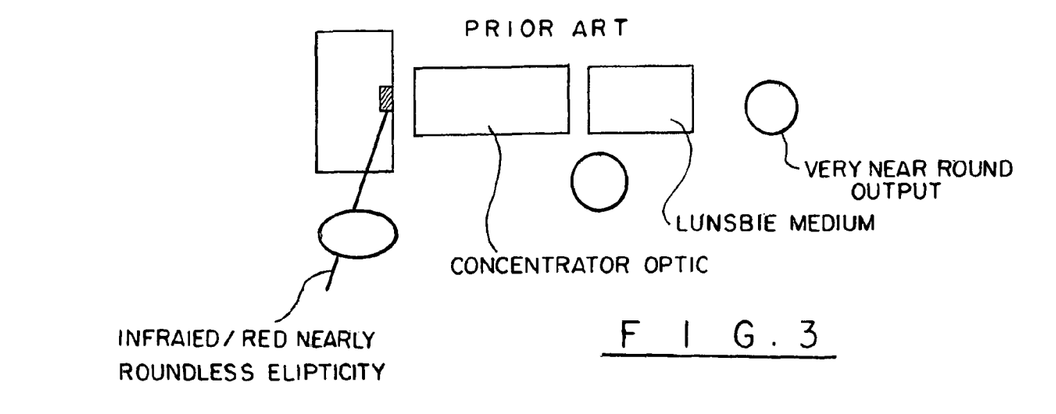
FIG. 3 is a block diagram illustrating production of a laser beam output in a laser system according to one prior patent.

FIGS. 2 and 3 illustrate production of laser beam output comparing the round tunable output of the system of the present invention with the output of the laser system according to U.S. Pat. No. 5,317,447. In this example, the lasing crystal 40 produces infrared diffraction limited emission, while the KTP crystal 46 produces a green diffraction limited output by process of second harmonic generation. In comparison, the laser device of the '447 patent does not use imaging optics for a diffraction limited output, instead employing concentrator optics that produce a non-diffraction limited output. The output of the '447 unstable diode is directed into a concentrator optics assembly. Furthermore, the light is gathered by the high index concentrator optics in the '447 patent, from where it is directed into the tunable medium.

In contrast, the light beam exiting the KTP crystal in the instant device is further directed through a beam expanding lens 48, collimating lens 50, and focusing lens 52 before it reaches the tunable medium, Ti:Sapphire crystal 68. The resultant laser beam output of the instant device is diffraction limited and widely tunable, while the output of the device according to the '447 patent will not produce such high quality tunable output owing to the quality of the pump beam.

It should be noted that there are further differences between the instant invention and a known laser device of the '447 patent. For instance, the pumping diode 36 in the instant invention is a stable diode that produces an elliptical beam, 808 nm wavelength (well matched to the absorption of the Nd: doped host material of the crystal, while the '447 patent uses an unstable resonator producing a beam in 610-690 nm wavelength range. The beam profile conversion of the instant device takes advantage of the lasing source Nd: doped host crystal that produces diffraction limited beam, which is converted into diffraction limited frequency doubled beam at a green wavelength. In contrast, the '447 patent does not provide for a frequency conversion arrangement, sending the nearly round diode output directly into tunable medium.

Additionally, the instant invention uses Tunable medium of Ti:Sapphire that has a greater tuning range than any other solid state medium (660 nm-1170 nm). The beam must be pumped at green wavelength. The '447 patent uses Cr:doped fluoride based host material as a tunable medium. Such material has less tunablility and must be pumped at a red near-IR wavelength. There exist other substantial differences between the instant invention and known technical solutions, providing considerable advantages to the device 10.

Figure 4:
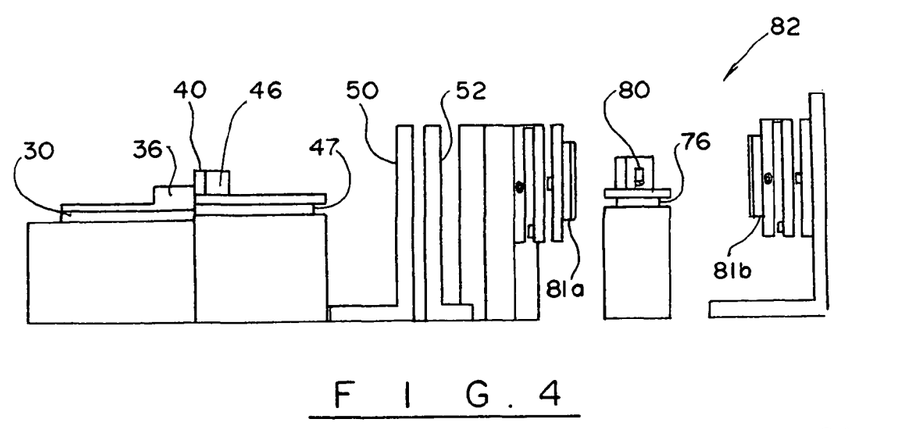
FIG. 4 is a schematic view illustrating an embodiment of the instant invention with a confocal resonator.
Figure 5:
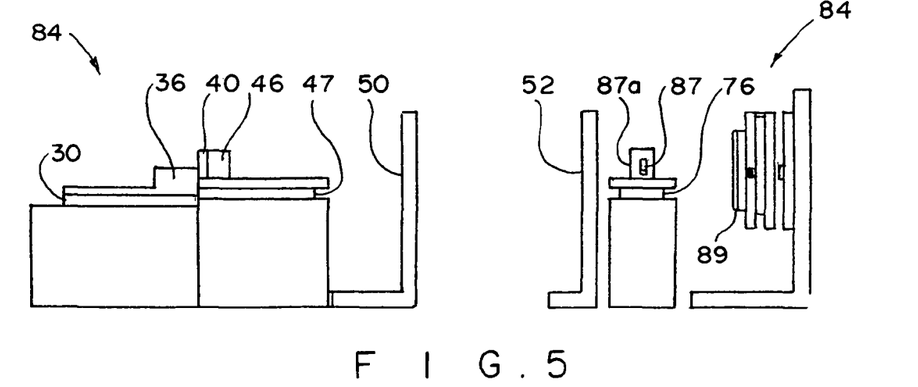
FIG. 5 is a schematic view illustrating an embodiment of the instant invention with a hemispherical resonator and using a lasing medium with one Brewster-angle cut face.
Figure 6:
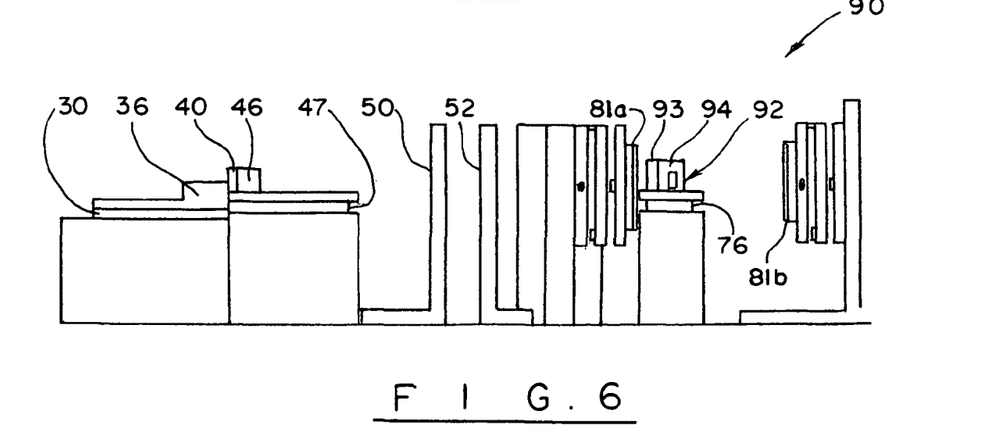
FIG. 6 is a schematic view illustrating an embodiment of the instant invention with a hemispherical resonator and using a lasing medium with two Brewster-angle cut faces.

FIGS. 4, 5, and 6 schematically illustrate various embodiments of the instant invention using different resonator configurations, although all of the resonators are stable resonators and include a titanium-sapphire lasing medium. In FIG. 4, the Ti:Sapphire crystal 80 is positioned in a confocal resonator 82. The confocal resonator 82 has equal curvature mirrors 81a and 81b equal to the cavity length ($R_1=R_2=L$). This laser system incorporates a BASE module pump laser 36, a monolithic resonator, KTP frequency doubling crystal, imaging lens pair, and a confocal cavity with the broadly tunable medium wedged at both surfaces by Brewster's angle, $\theta_B$. Brewster-angle cut edges of the lasing medium (titanium-sapphire crystals) introduce polarization-dependent losses. This forces the laser to emit light with a stable linear polarization, the direction of which corresponds to p polarization at the Brewster-angle cut crystal 80. In this state of operation, the losses caused by the Brewster-angle cut crystal 80 are very low. The system may also include a TEC controller 47 coupled to the KTP crystal 46 and a TEC controller 76 coupled to the crystal 80.

FIG. 5 schematically illustrates a stable hemispherical resonator 84 that includes a Ti:Sapphire lasing medium 86 having one Brewster-angle cut face 87. In this embodiment, a curved resonator mirror with coated crystal 89. This laser system incorporates a BASE module pump laser, monolithic stable resonator, doubling crystal, imaging lens pair and a hemispherical cavity containing the broadly tunable medium with a single Brewster angled surface with a flat high reflector at the lasing wavelength on the opposing surface. The hemispherical resonator also contains tuning elements, linewidth narrowing elements and a Q-switching element.

The hemispherical resonator 84 uses a Ti:Sapphire crystal having a flat entry surface 87a coated within an anti-reflection coating at the DPSS pump wavelength and an highly reflective coating over a range of wavelengths 650-1170 nm. Opposite face of the crystal 87 is cut at Brewster's angle to reduce intracavity losses over a broad range of wavelengths.

FIG. 6 schematically illustrates a stable hemispherical resonator 90 that includes a Ti:Sapphire lasing medium 92 having entry and exit faces 93, 94 cut at Brewster's angle. This embodiment also incorporates a BASE module pump laser, stable monolithic resonator, doubling crystal, imaging lens pair, and a hemispherical cavity with the broadly tunable medium. This hemispherical resonator also contains contain tuning elements, linewidth narrowing elements and a Q-switching element. End mirror near the focusing lens is a flat dichroic using an anti-reflection coating on the surface nearest the pump source and a high reflector facing the tunable medium. The output coupling mirror uses a partially reflective coating at the lasing wavelength.

In all above-discussed embodiments, the pumping beam emitted by high-power diode laser 36 is typically astigmatic and has a noncircular radiation pattern whenever the diode laser 36 is of the broad area emitter type. FIG. 2 illustrates the infrared elliptical output produced by the pumping diode 36. The stable 808 nm infrared diode 36 emits the elliptical beam from the facet, which propagates directly into the lasing crystal 40. The lasing crystal then absorbs the radiation created by the pumping diode 36.

The absorbed pumped radiation is converted into infrared laser radiation, which lases in a diffraction-limited beam. The combination of thermal effects induced by the pumped beam and consequential cavity stability parameters force the lasing mode into a fundamental TEM oo profile while passing through the lasing crystal and the KTP crystal. While travelling through the KTP crystal, the diffraction-limited laser mode propagates intracavity through the second harmonic generation crystal in order to produce a diffraction-limited second harmonic output. The diffraction-limited second harmonic generation is directed into the tunable medium, Ti:Sapphire crystal, which then lases in an ideal transverse output due low $M^2$ value of the pump as well as excellent volumetric overlap.

The output wavelength of high-power diode laser 26 may be adjusted by temperature tuning, i.e. controlling the voltage supplied to the thermoelectric cooler package 30, to which high-power diode laser 26 is mounted. The spectral output of high-power diode laser 26 is commonly adjusted to a preselected wavelength that is within the absorption bandwidth of solid-state lasant 36.

In one aspect of the invention a dichroic coating is applied to a rear surface of the cavity mirror 81$a$ to form one end of resonator cavity 60, while an output surface of the solid-state Ti:Sapphire lasant has a wedge angle, which may be the Brewster's angle discussed above and defined by the emission wavelength and refractive index of medium. Further, the output surface of the Ti:Sapphire crystal may be coated highly transmissive at the lasant emission wavelength. A concave output coupling mirror 70, partly transmissive at the lasant emission wavelength, forms the opposite end of resonator cavity 60.

In one aspect, the nonlinear bulk crystal 46 is placed external to the monolithic solid state resonator. The nonlinear bulk crystal is selected from a group with a high nonlinear coefficient including KTP and LBO. The solid-state laser output, which is linearly polarized with polarization direction parallel to the crystallographic axis c-axis of lasant 36, is directed into the input face of the double medium of the KTP crystal 46. The nonlinear frequency doubling medium is mechanically oriented in a mount such that the input beam polarization direction is in correct orientation to be doubled effectively by type one, critical phase matching.

Birefringent plates (shown at 110 and 112 in FIG. 7) or other tuning elements, may be introduced into the resonator cavity 100, according to the analyses well-known to the art of Bloom in "Modes of a Laser Resonator Containing Tilted Birefringent Plates" Journal of the Optical Society of America, vol. 64, No. 4, 447-452. The birefringent plates may be fabricated from quartz or similar birefringent materials. The birefringent plates are positioned downstream of the solid state lasant and are mounted in a generally parallel relationship to each other. The birefringent plates 110, 112 are tilted at Brewster's angle.

Figure 7:
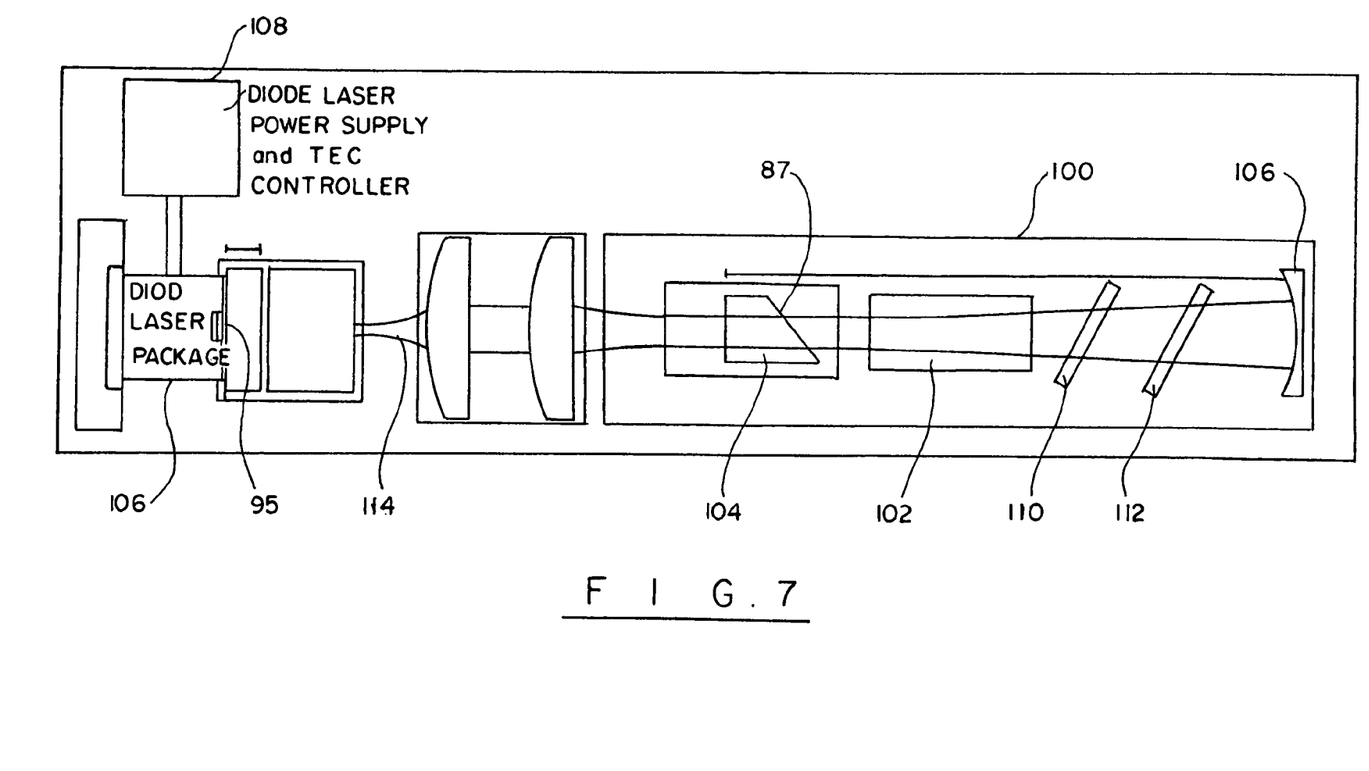
FIG. 7 is a schematic view illustrating an embodiment of the instant invention with a hemispherical resonator and using a pair of birefringent plates in the resonator.

With further reference to FIG. 7, the resonator cavity 100 may also include a q-switch 102 mounted between the lasant 104 and an output coupling mirror 106. It is possible that inclusion of the q-switch 102 within the solid-state resonator cavity 100 may require adjustment of most of the dimensions to compensate for the elongated solid-state oscillator cavity 100. However, the device 10 can remain a compact configuration even with the inclusion of the modulator 102.

The output wavelength of high-power diode laser 106 may be adjusted by temperature tuning, i.e. controlling the voltage supplied to the thermoelectric cooler package 108, to which high-power diode laser 106 is mounted. The spectral output of high-power diode laser 106 is commonly adjusted to a preselected wavelength that is within the absorption bandwidth of solid-state lasant 104. The efficiency with which the optical power of the frequency doubling crystal converts into optical power of the visible output beam 114 can be optimized by selection of the orientation of the nonlinear medium and spectral bandwidth of the pump beam.

In all embodiments, the crystal length and dopant level are selected concurrently with the pump radius, resonant mode radius, and output coupler transmission to generate advantageous values for the pumping beam power required to reach laser threshold. In all embodiments, high-powered BASE module is positioned so that its optical axis is substantially coaxial to an optical axis extending through resonator cavity of the monolithic solid state laser.

Broad Area high powered stable diode can be fabricated with a broad range of output powers from 100 mW to 15 W. As described above, both high reflector and output coupler mirrors are coated directly or cleaved to form the flat facets of the optical resonator, which ranges from 0.5 mm to 30 mm in length depending upon the gain of the semiconductor medium. BASE modules have active areas widths between 10-400 microns and thickness of 0.005-2 microns. Such resonators will have unity magnification and maintain stability by thermal gradients in the active region leading to thermal focusing.

Conventional high-powered diode lasers and arrays of diodes laser used for pumping solid-state lasants exhibit lateral spatial coherence but little transverse coherence. Typically the lack of spatial coherence results in a high output which is collected by a pair of cylindrical lens effectively correcting the fast axes and slow axes respectively. Despite a corrected divergence in both axes the propagation behavior will vary due to a differing $M^2$ in the lateral and transverse directions respectively. Imaging beams in sagittal and tangential planes of differing quality can lead to overlap discrepancies. This invention alleviates this difficulty by placing the monolithic crystal in close contact with the diode result of which the spatial extent of beam divergence is minimized. Placing the crystal facing nearest the diode facet utilizes a small pump waist to produce ideal overlap while simultaneously minimizing laser threshold by increasing the respective intracavity intensity at the focus. Furthermore, the pump radius is well-matched to the radius and length of a lasant mode volume. The lasant mode volume constitutes the portion of mode or beam volume of resonator cavity that is contained within solid-state lasant. Persons skilled in the art will appreciate that the mode or beam volume is shown greatly enlarged for ease of visualization and does not represent a true path through the other elements in FIG. 1.

This arrangement effectively reduces the power of optical output required from high-powered BASE modules to obtain threshold operation of solid-state laser. Furthermore, optical pumping beam is preferably selected with lasant mode volume to produce $TEM_{00}$ mode laser operation, a useful property which allows optical output beam from resonator cavity to be readily focused by a lens assembly employing conventional optical methods.

The instant invention overcomes the problem of limited optical brightness of a high-power gain-guided diode laser or array of diode lasers caused by lateral spatial incoherence of the optical output arising from filamentation. Transverse reduction of the gain profile gives rise to filamentation of the optical output. The resulting increase in the refractive index in the portion of the active area contributing most strongly to the optical mode results in an increase in the refractive index bounded by the smaller refractive index values in the surrounding portions of the active region that are not contributing as strongly to the optical mode. This variation in the index profile within the active area is broader than about 5-10 microns, which is typical in the case of many laser devices. Such index-guided region of the active area may be in the form of a filament that is spatially incoherent with respect to neighboring filaments. This filamentation phenomenon, therefore, is a fundamental source of lateral spatial incoherence in high-power diode lasers, and consequently, contributes to limiting the optical brightness of broad area emitters.

The system 10 can be used for directing the usable output toward medical agents to photoactivate them; it can also be used for directing the usable laser output toward electronic materials to process them, as well as for many other useful applications.

Many changes and modifications can be made in the design of the present invention without departing from the spirit thereof. I, therefore, pray that my rights to the present invention be limited only by the scope of the appended claims.

I claim:

1. A laser system for emitting continuous wave output within a preselected range of wavelengths, comprising:
    a solid-state lasing element, doped with an active ion that is pumped with a first wavelength and generating emission with a second wavelength in response to the pumping light;
    a light optimizing solid state optical laser medium configured to optimize output light emitted by the lasing medium, said optimizing laser medium being close-coupled to the lasing medium, said frequency conversion arrangement generating output in a third wavelength;
    a stable resonator defining a laser resonator cavity and housing a solid-state lasant, at least two highly reflective end elements, and an output coupler reflective element arranged to form a reflective path defining said laser resonator cavity there between, said resonator being configured to receive the light beam in the third wavelength and produce a solid-state laser optical output in a 650-1170 nanometers range;
    wherein said solid state lasing element is selected from a group consisting of neodymium-doped solid-state crystalline host materials;
    wherein said titanium-doped sapphire crystal comprises an exit face cut at a Brewster's angle;
    wherein said resonator comprises a tuning element configured to select wavelength output of said solid-state lasant; and further comprising at least one thermo-electric controller.

2. The system of claim 1, wherein said optical conversion process comprises a solid-state potassium titanium phosphate nonlinear crystal.

3. The system of claim 2, wherein the optimizing laser medium comprises an antireflection coated upstream face and a high reflection coated emission face.

4. The system of claim 1, wherein the solid-state lasant comprises a titanium-doped sapphire crystal.

5. The system of claim 4, wherein the solid-state lasant is configured to generate a light beam within narrow linewidths tunable over a wide range of wavelengths.

6. The system of claim 4, wherein said titanium-doped sapphire crystal comprises an entry face and an exit face, each of said entry and exit faces being cut at a Brewster's angle.

7. The system of claim 1, wherein the laser element is configured to convert the pumping light into infrared laser radiation that lases in a diffraction-limited beam.

8. The system of claim 7, wherein the optimizing laser medium is configured to produce a diffraction-limited second harmonic output light beam.

9. The system of claim 1, wherein said third wavelength is between 530 nanometers and 534 nanometers.

10. The system of claim 1, further comprising a diode emitter configured to produce an optical output greater than 1 watt of continuous wave power.

11. The system of claim 10, further comprising a semiconductor pumping element configured to produce a light emission within the first wavelength.

12. The system of claim 1, further comprising a laser beam expander element mounted in a light-receiving alignment with the optimizing laser medium output.

13. The system of claim 12, further comprising a collimating optical member mounted transversely to an axis of a laser light beam passing through the laser beam expander optical element, said collimating optic being configured to create short focal length collimation of the laser light beam.

14. The system of claim 12, further comprising a focusing lens mounted on an exit side of the collimating optic, said focusing lens being configured to produce a pre-determined beam diameter at a usable working distance.

15. The system of claim 1, wherein said resonator is a confocal resonator.

16. The system of claim 1, wherein said resonator is a hemispherical resonator.

17. The system of claim 16, wherein said tuning member comprises generally parallel birefringent plates mounted downstream of said solid state lasant.

18. The system of claim 1, wherein said resonator comprises a modulator mounted between the lasant and the output coupler reflective element.

19. The system of claim 18, comprising birefringent plates mounted between the modulator and the output coupler reflective element.

20. The system of claim 19, wherein said birefringent plates are mounted in a spaced parallel relationship to each other.

21. A laser system for continuous emission within a preselected range of wavelengths, comprising:
    a hollow housing having a first end wall, a second end wall, and a top plate;

an electrically powered semiconductor laser element configured to emit an output of pre-selected wavelength;

a lasing element configured to utilize the light beam emitted by the laser element;

a solid state wavelength frequency converter configured to convert the wavelength of the amplified light beam to a wavelength of between 530 nanometers and 534 nanometers; and a stable resonator defining a laser resonator cavity and housing a solid-state lasant, at least two highly reflective end elements, and an output coupler reflective element arranged to form a reflective path defining said laser resonator cavity there between, said resonator being configured to receive the amplified light beam and produce a solid-state laser optical output in a 650-1170 nanometers range; wherein the solid state lasant comprises a titanium-doped sapphire crystal;

wherein said titanium-doped sapphire crystal comprises an exit face cut at a Brewster's angle;

wherein said tuning member comprises contacted generally parallel birefringent plates; and wherein cooling fans are mounted in the first end wall of the housing.

22. The system of claim 21, wherein said titanium-doped sapphire crystal comprises an exit face cut at a Brewster's angle.

23. The system of claim 21, wherein the solid-state lasant is configured to generate a light beam within narrow linewidths tunable over a wide range of wavelengths.

24. The system of claim 21, wherein the frequency converter comprises a solid-state lasing element, doped with an active element that is pumped by the amplified light beam and a light optimizing solid state optical laser medium configured to optimize output light emitted by the lasing medium, said optimizing laser medium being close-coupled to the lasing medium.

25. The system of claim 24, wherein said solid state lasing element is selected from a group consisting of neodymium-doped crystalline host materials.

26. The system of claim 25, wherein the optimizing laser medium comprises an antireflection coated upstream face for the pump at a preselected wavelength and an antireflection coating for the emission wavelength at the emission face.

27. The system of claim 24, wherein said frequency conversion arrangement comprises a solid-state potassium titanium phosphate nonlinear crystal.

28. The system of claim 21, wherein said anti-reflective coated elements comprise curved elements having a curvature radius configured to couple the pumping light into said solid-state lasant.

29. The system of claim 21, further comprising a laser beam expander element mounted in a light-receiving alignment with the wavelength frequency converter.

30. The system of claim 29, further comprising a collimating optical member mounted transversely to an axis of a laser light beam passing through the laser beam expander optical element, said collimating optical element being configured to collimate laser output.

31. The system of claim 30, further comprising a focusing lens mounted on an exit side of the collimating optical member, said focusing lens being configured to produce a predetermined beam diameter at a usable working distance.

32. The system of claim 21, wherein said resonator is a confocal resonator.

33. The system of claim 21, wherein said resonator is a hemispherical resonator.

34. The system of claim 21, wherein said resonator comprises a tuning elements mounted in light-receiving relationship to said lasant, said tuning member being configured to select wavelength output of said solid-state lasant.

35. The system of claim 34, wherein a collimating output lens is mounted external to the, said output coupler being configured to collimate the selected wavelength output from the tunable laser cavity.

36. The system of claim 21, wherein a light filter is secured adjacent the second end wall of the housing, said light filter being configured to filter residual non-absorbed green wavelength light while allowing infrared wavelengths to exit the housing.

37. The system of claim 21, wherein an opening is formed in a top plate of the housing, said opening being configured to accommodate a control panel.

* * * * *